United States Patent [19]

Almy et al.

[11] Patent Number: 4,575,818

[45] Date of Patent: Mar. 11, 1986

[54] APPARATUS FOR IN EFFECT EXTENDING THE WIDTH OF AN ASSOCIATIVE MEMORY BY SERIAL MATCHING OF PORTIONS OF THE SEARCH PATTERN

[75] Inventors: Thomas A. Almy, Tualatin; Thomas E. Merrow, Beaverton, both of Oreg.

[73] Assignee: Tektronix, Inc., Beaverton, Oreg.

[21] Appl. No.: 502,048

[22] Filed: Jun. 7, 1983

[51] Int. Cl.$^4$ .............................................. G11C 15/00
[52] U.S. Cl. ...................................... 365/49; 365/189
[58] Field of Search .......................... 365/49, 189, 230

[56] References Cited

U.S. PATENT DOCUMENTS 4,296,475 10/1981 Nederlof et al. .................... 365/49

Primary Examiner—Terrell W. Fears
Attorney, Agent, or Firm—John Smith-Hill; Robert S. Hulse; Allston L. Jones

[57] ABSTRACT

A circuit (11) for use in an associative memory device, one such circuit being associated with each word location in memory, for indicating a match when the word associated with a given circuit (11) is a match for a current portion of a search pattern and the previous word is a match for a previous portion of the search pattern. In operation of the circuit (11), a latch (23) is initialized to a match condition, and provides a match output, which is also applied to the next successive circuit, for the next successive word in memory. The latch (23) is controlled by an AND gate (21), to which is applied the output signal from the circuit for the previous word in memory and a signal indicating a match or non-match for the word in memory associated with circuit (11) containing AND gate (21).

2 Claims, 1 Drawing Figure

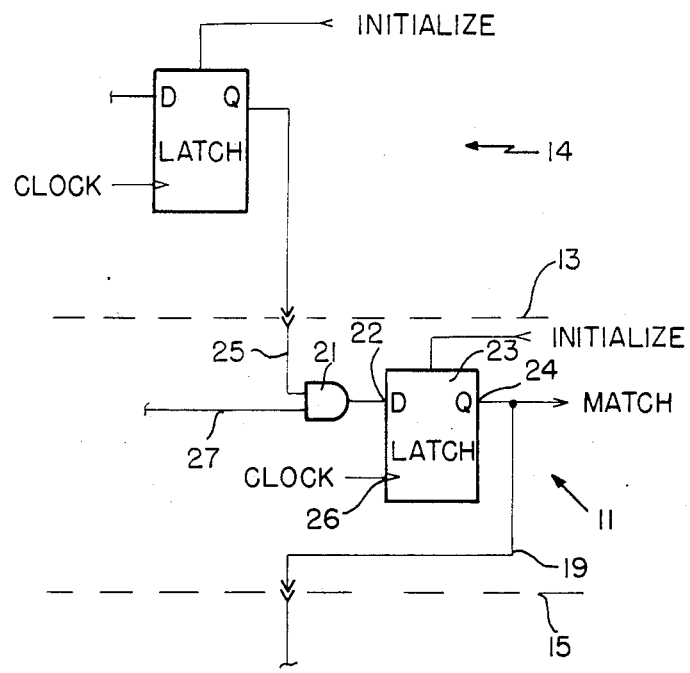

APPARATUS FOR IN EFFECT EXTENDING THE WIDTH OF AN ASSOCIATIVE MEMORY BY SERIAL MATCHING OF PORTIONS OF THE SEARCH PATTERN

DESCRIPTION

Technical Field

This invention relates to the art of associative memories, which are storage devices constructed in such a manner that every cell in memory can be simultaneously addressed, and hence searched.

BACKGROUND OF THE INVENTION

An associative memory is searched by content as opposed to physical location. As in other memories, the individual cells comprising the associative memory each contain one bit of information. A given number of bits form a word. In an associative search, the words in memory are compared simultaneously (in parallel) against a known search pattern which comprises a series of data bits. Any matches are detected and the physical locations of the cells containing matched data are determined. The primary advantage of an associative memory is that a search of the entire memory may be made quickly, essentially in the time that it takes to make a search of one word.

Some associative memories are limited by their design to a particular width and are not extendible by cascading memories together. Such memories thus have a maximum number of bits for a given word, i.e. 16 bits, and for such memories, search patterns longer than 16 bits cannot be searched reliably. This can be a significant disadvantage, and the applicability of such memories is correspondingly limited.

Other associative memories are designed so that they can be searched only with fixed length search patterns. This can be a disadvantage, as it is sometimes desirable to have a variable length search pattern capability.

SUMMARY OF THE INVENTION

The present invention is for use in an associative memory and includes circuit means, which is associated with a given word location in the memory device, for indicating a match when (1) the data contained in the given word location matches with that portion of a selected search pattern used for a current associative search of the memory and (2) the data contained in the previous word location in the memory device matched that portion of the selected search pattern which was just previously used for an associative search of the memory.

DESCRIPTION OF THE DRAWINGS

The FIGURE is a logic block diagram of the circuit of the present invention.

BEST MODE FOR CARRYING OUT THE INVENTION

The present invention, comprising a few logic elements, can conveniently be incorporated into present chip designs of associative memory devices. An example of an associative memory device with which the present invention is useful is disclosed in copending application Ser. No. 502,047, filed on the same day as this application, and titled High Storage Capacity Associative Memory, by Thomas Almy, one of the named inventors herein, which application is hereby incorporated by reference. That application discloses an associative memory device which includes an associative memory array having an output line for each word location, the signal condition of the output lines (high or low) providing an indication of whether or not a match has occurred for the contents of that location. The output lines from the array are each connected to an associated match detect circuit. The match detect circuits are designed so that the only match output indication is that of the first or lowermost match in the memory array.

The circuit of the present invention can be used between the memory array and the match detect circuits described above, as well as in other associative memories. The FIGURE shows the circuit of the present invention in block form. Each word location in the associative memory array has one circuit 11, shown between the dotted lines 13 and 15. The circuits are cascaded together as shown. A circuit 14 for the previous word in the associative memory array is shown above dotted line 13 and provides a signal to input line 25 of circuit 11 while the output line 19 from circuit 11 is connected to the input line of a similar circuit associated with the next successive word location in the associative memory array.

Circuit 11 comprises an AND gate 21 and a latch 23. The AND gate 21 has two input lines 25 and 27. Input line 25 is connected to the output line from the previous circuit, as explained above. Connected to input line 27 is a word select line from the associative memory. The word select line is from a given word location in memory. The signal condition of the line from the memory indicates whether a match has been achieved for that word relative to the search pattern. The associative search is carried out in the memory and the signal indication of the result is passed to AND gate 21.

The output of AND gate 21 is applied to one connection 22 of latch 23. The signal at the other connection 24 is the output of the circuit and is applied to follow-on circuitry, such as the match detect circuit disclosed in the copending application referred to above. In addition, output line 19 extends from the other connection 24 to one input line of the AND gate of the next successive circuit. Latch 23 also has a clock input 26, which clocks the latch.

In operation, the latch in each of the plurality of circuits is set by an initializing signal. Thus, the latch 23 is initially in its set condition, and there is a high at connection 24, which indicates a match, for all the circuits. The one input on line 25 to AND gate 21 is hence also initialized to a high. An associative search is then performed in the memory array (not shown) for a first portion of the search pattern. For instance, if the associative memory device is 16 bits wide, the first 16 bits of the search pattern is used for the associative search.

For those words in the associative memory which provide a match in content with the first portion of the search pattern, line 27 will be high so that both inputs to AND gate 21 will be high for the first search pattern portion for each word location in memory having a match. The output of AND gate 21 will in such a circumstance be high. However, if the condition of word select line 27 is low, indicating a non-match from the memory, the output of AND gate 21 is low. The latch is clocked at input 26 and the condition of the output 24 will depend upon the output of AND gate 21. Output 24 remains high (set) if there is a match indication from memory, and goes low for a non-match.

The next portion of the search pattern is then used for a further associative search of the memory. Thus, for a 16 bit associative memory, and a 32 bit search pattern, bits 17-32 form the search pattern for the further search. The associative memory performs the search and any matches are detected, resulting in a new pattern of signals on lines 27 to the successive circuits. The input on line 25 will be high only when there has been a match for the previous word location in memory for the search of the first portion of the search pattern, and the signal on line 27 will be high only when there has been a match in the memory for that circuit for the current portion of the search pattern. The latch will then be clocked again and the condition of output 24 will be high (set) only when there has been a match of the two successive words in memory with the two portions of the search pattern. Such a sequential search of portions of the search pattern continues until the full pattern has been searched. The latch is clocked between each search. Thus, a search pattern of M×N bits, in a memory N bits wide, may be performed in M clock periods. The performance of the associative memory is correspondingly degraded by the use of such a sequential searching technique, but the slight loss in performance is usually outweighed substantially by the gain in search flexibility.

Thus, search patterns wider than the associative memory itself can be used as well as variable length search patterns. Although a preferred embodiment of the invention has been disclosed herein for purposes of illustration, it should be understood that various changes, modifications and substitutions may be incorporated in such embodiment without departing from the spirit of the invention as defined by the claims which follow.

We claim:

1. Apparatus for use in an associate memory device, having a clock in association therewith, comprising:
   a plurality of circuit means, each associated with a different word location in the memory device for indicating a match when (1) the data contained in said word location matches with that portion of a selected search pattern being currently associatively searched and (2) the data in the previous word location in the memory device matches with that portion of the search pattern previously associatively searched;
   the first of said plurality of circuit means includes a latch under the control of said clock, which clocks the latch, and a match/non-match signal indication for the data contained in the first word location in the memory device;
   each of the other of said plurality of circuit means includes a latch and an AND gate, said latch being controlled by the condition of the output signal of said AND gate and the clock which clocks the latch, the AND gate having applied as input signals thereto (1) a match/non-match signal indication from the previous circuit means and (2) a match/non-match signal indication for the data contained in the word location in the memory device associated with said circuit means; and
   the latch of each of said plurality of circuit means being in operation initialized to initially provide a match indication; and
   means for applying said match indication from each latch to another circuit means associated with the next successive word location in the memory device.

2. An apparatus of claim 1, wherein said clock means is set so as to clock the latch means following completion of associative searching of successive portions of the search pattern.

* * * * *